United States Patent [19]
Choi

[11] Patent Number: 6,137,729
[45] Date of Patent: Oct. 24, 2000

[54] METHOD FOR ERASING MEMORY CELLS IN A FLASH MEMORY DEVICE

[75] Inventor: Ki-Hwan Choi, Seoul, Rep. of Korea

[73] Assignee: Samsung Electronics Co., Ltd., Rep. of Korea

[21] Appl. No.: 09/213,723

[22] Filed: Dec. 17, 1998

[30] Foreign Application Priority Data

Dec. 29, 1997 [KR] Rep. of Korea ............ 97-77267

[51] Int. Cl.[7] .................................................. G11C 16/00
[52] U.S. Cl. ................................ 365/185.29; 365/185.11
[58] Field of Search ...................... 365/185.29, 185.09, 365/185.11, 185.22; 711/103, 154, 152, 163

[56] References Cited

U.S. PATENT DOCUMENTS 5,355,464  10/1994  Fandrich et al. ............... 365/185.29
5,546,561  8/1996   Kynett et al. ................... 711/163
5,559,988  9/1996   Durante et al. ................. 711/152
5,822,244  10/1998  Hansen et al. ................. 395/185.11
5,937,424  8/1999   Leak et al. ..................... 365/185.29
5,940,861  8/1999   Brown et al. ................... 711/154

*Primary Examiner*—Tan T. Nguyen
*Attorney, Agent, or Firm*—Myers Bigel Sibley & Sajovec

[57] ABSTRACT

A method for erasing electrically erasable and programmable memory cells arranged in a plurality of sectors, in a memory device receiving a suspend command and a resume command, the erasing having steps of pre-programming, main erasing and post-programming, is disclosed. The method includes the steps of stopping a current step of the erasing when the suspend command appears thereat and storing a flag signal in a predetermined memory area, performing a read or programming for another sector after the stopping the current step until the resume command is applied thereto, and resuming the current step in response to an activation of the resume command.

1 Claim, 4 Drawing Sheets

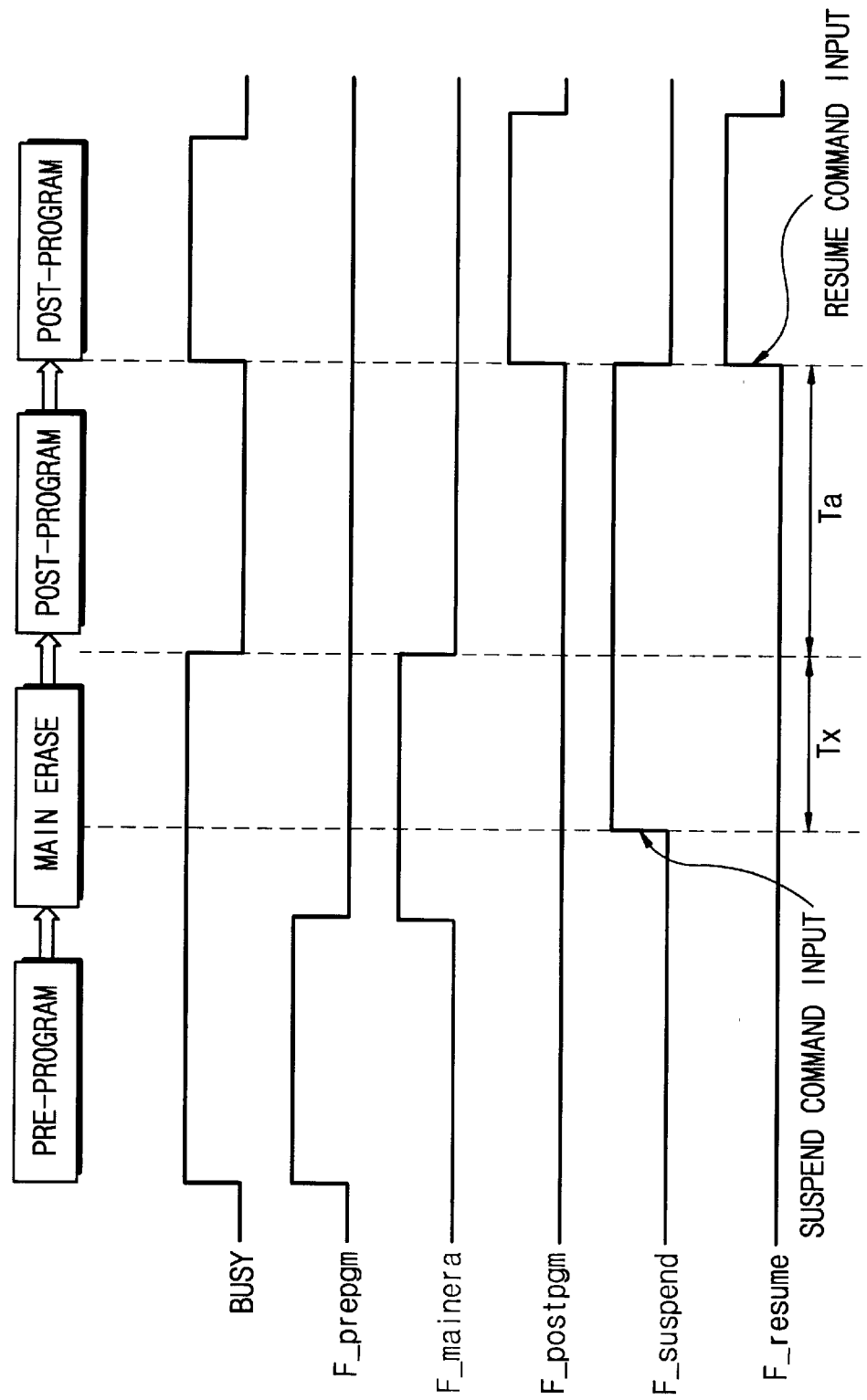

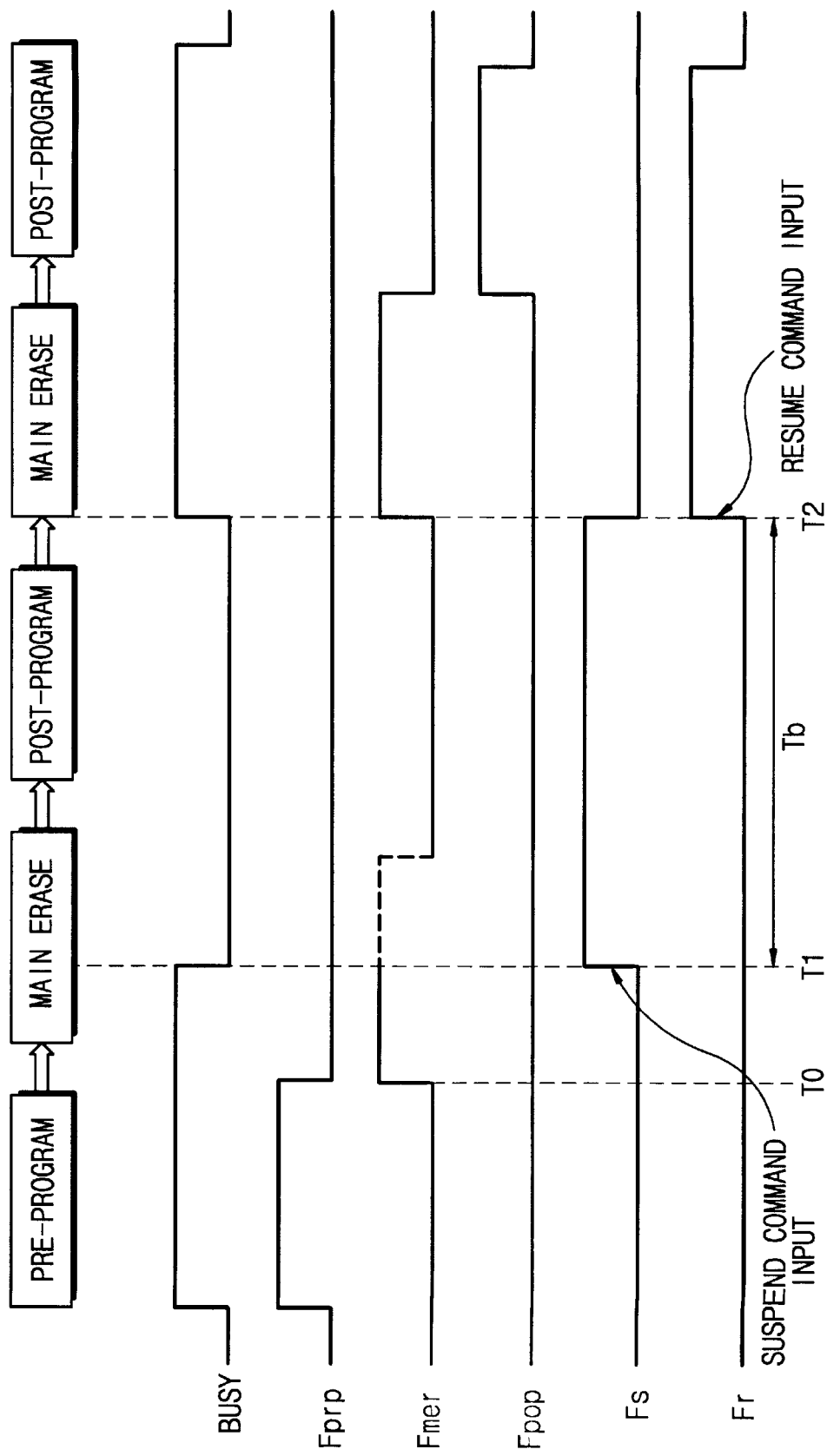

METHOD FOR ERASING MEMORY CELLS IN A FLASH MEMORY DEVICE

FIELD OF THE INVENTION

The present invention relates to nonvolatile memory devices, and more particularly to a method for erasing memory cells in a flash electrically erasable and programmable read only memory device possible of receiving a suspend command.

BACKGROUND OF THE INVENTION

Flash memories have advanced performances in accessing data, than any other kind of nonvolatile memories such as electrically erasable and programmable read only memories, for a reading and writing (or programming). The merit of high speed operation in the flash memory has been regarded to be very adaptable to portable computing apparatuses, cellular phones or digital still cameras. In general, there are two kinds of the flash memory, such as the NAND-type in which memory cells are connected from a bit line in serial, and the NOR-type in which memory cells are connected to a bit line in parallel.

Typical construction of the cell (or cell transistor) of the flash memory is shown in FIG. 1, which can be used for the multi-bit storage. Source 3 and drain 4, each being formed of N+ diffused region in P+ semiconductor substrate 2, are separated each other through a channel region which is also defined in substrate 2. Floating gate 6 is formed over the channel region through thin insulating film 7 which is under 100 Å, and insulating film 9, such as an O-N-O (Oxide-Nitride-Oxide) film, on floating gate 6 isolates control gate 8 from floating gate 6. Source 3, drain 4, control gate 8 and substrate 2 are each connected to their corresponding voltage sources Vs (drain voltage), Vd (source voltage), Vg (gate voltage) and Vb (bulk voltage), for programming, erasing and reading operations.

In programming, as well known, a selected memory cell is programmed by means of a hot electron injection between the channel region and floating gate, in which the source and substrate are held in a ground voltage, a high voltage (e.g., Vg=10 V) is applied to the control gate and a voltage to induce the hot electrons therein, 5 V through 6 V, is provided to the drain. After programmed, a threshold voltage of the selected memory cell is increased therefrom due to deposition of electrons. To read data from the programmed cell, a voltage of about 1 V is applied to the drain, a power source voltage (or about 4.5 V) is applied to the control gate, and the source is held in the ground voltage. Since the increased threshold voltage of the programmed memory cell acts as an blocking potential even upon the gate voltage during a read-out operation, the programmed cell is considered to as an off-cell which has a threshold voltage between 6 V and 7 V.

Erasing a memory cell is accomplished by conducting F-N (Fowler-Nordheim) tunneling effect, in which the control gate is coupled to a high negative voltage of about -10 V, and the substrate (or bulk) to a positive voltage of about 5 V, in order to induce the tunneling therebetween. While this, the drain is conditioned at a high impedance state (or a floating state). A strong electric field induced by the voltage bias conditions, between the control gate and bulk region, causes the electrons to be moved into the source. The F-N tunneling normally occurs when the electric field of 6~7 MV/cm is developed between the floating gate and bulk region which are separated through the thin insulating film under 100 Å. The erased cell has a lower threshold voltage than before, and thereby sensed as an on-cell which has a threshold voltage between 1~3 V.

In an usual architecture of a memory cell array in a flash memory, the bulk region (or the substrate) combines active regions of memory cells, so that memory cells formed in the same bulk region are spontaneously erased in the same time. Therefore, units of erasing (hereinafter referred to as "sector", for instance, one sector of 64K) is determined in accordance with the number of separating the bulk regions. Table 1 shows levels of the voltages used in programming, erasing and reading.

TABLE 1

| operation mode | Vg | Vd | Vs | Vb |
|---|---|---|---|---|
| programming | 10V | 5~6V | 0V | 0V |
| erasing | -10V | floating | floating | 5V |
| reading | 4.5V | 1V | 0V | 0V |
| erase repairing | 3V | 5~6V | 0V | 0V |

Once an erase operation for memory cells is performed, there are memory cells, having their threshold voltages under 0 V, among memory cells which are erased and whose threshold voltages are positioned at an range of distribution uniformity. The memory cells with threshold voltage of 0 V are referred to as over-erased cells that have to be cured by an repairing operation (i.e., erase repairing) in order to have threshold voltages properly higher than 0 V. In a general erase repairing operation, the source and substrate of the over-erased memory cell are grounded, the control gate is connected to a positive voltage about 3 V that is lower than a program voltage (e.g., 10 V), and the drain is connected to a positive voltage about 5 V through 6 V, so that negative charges smaller than those in the programming operation are gethered in the floating gate electrode and, as shown in FIG. 2, thereby the negative potential formed at the gate electrode causes the threshold voltage of the memory cell to be increased over 0 V (or the ground voltage). The erase repairing operation is performed after completing a normal erasing and referred to as post-programming.

The post-programming operation, as shown in FIG. 3, is subsequent to a main erase operation which is carried out just after pre-programming. The pre-programming, the main erasing and post-programming compose a general erase cycle. The pre-programming employs a biasing condition that is the same with that of a normal programming, in which selected word line and bit line are conductive with 10 V and 5 V, respectively, so as to prevent an occurrence of an over-erased cells in the main erasing subsequent thereto.

Threshold voltages of pre-programmed memory cells moves to the levels at least higher than about 6 V (i.e., a threshold voltage of an Off-cell). Next, the main erase operation is performed to make memory cells be on-cells. Since there could be over-erased cells after the main erasing although the pre-programming has been preceded, the post-programming step is activatedjust after completing the main erasing operation. In each of the steps of the pre-programming, the main erasing and post-programming, verifying steps are interstitially included therein to determine whether or not further programming or erasing steps are in need. While those operating steps for erasing and curing, an usual flash memory could receive specific commands such as "suspend" and "resume". The command "suspend" causes a present erase operation for a selected sector to be interrupted therein, but rendering other sectors to be operable of reading and programming, and the command "resume" makes the halted erase operation be activated again.

FIG. 4 shows a operating timing when the suspending command is applied to a flash memory while the aforementioned erase mode (including the pre-programming, the main erasing and post-programming) is being conductive. For more detail, see U.S. Pat. No. 5,355,464 entitled Circuitry and Method for Suspending the Automated Erasure of Non-Volatile Semiconductor Memory. As shown in FIG. 4, if the flag signal for suspending, F_suspend, is activated during the period of main erasing, reading and programming for another sector are performed after completing the current erasing operation, i.e., after e main erasing flag signal F_mainera is disabled to low). It is impossible to be operable of reading or programming for another sector until the main erasing for a current sector is over. The period from the input of the suspend command to the time expiring the current main erasing, Tx, does not permit any other operation but the currently-conductive main erasing operation. The read or programming for another sector is permitted to be conductive for the time period Ta for which busy signal BUSY is being inactivated after the main erasing is over. In the state of inactivating with busy signal BUSY after the main erasing, if the flag signal of resuming F_resume is applied thereto, the next step of the main erasing, i.e., post-programming, starts to proceed for the sector selected in the main erasing operation.

However, in the operation shown in FIG. 4, since any functional operation can not be enabled but the current main erasing when the command "suspend" appears therein, there would be an limit in extending an operational application that, for instance, it is necessary to quickly turn a current operation to a read or programming for another sector after the command of suspending.

SUMMARY OF THE INVENTION

The present invention is intended to solve the problems. And, it is an object of the invention to provide a method for making a faster transition to a read or programming for another sector even after the command of suspending appears during a main erasing cycle.

In order to accomplish those objects, a method for erasing electrically erasable and programmable memory cells arranged in a plurality of sectors, in a memory device receiving a suspend command and a resume command, the erasing including steps of pre-programming, main erasing and post-programming, the method includes the steps of stopping a current step of the erasing when the suspend command appears thereat and storing a flag signal in a predetermined memory area, performing a read or programming for another sector after the stopping the current step until the resume command is applied thereto, and resuming the current step in response to an activation of the resume command. Though the suspend command appears any time during the erase mode including pre-programming, main erasing and post-programming, there is not any delay in performing a read or programming for another sector until the resume command is applied thereto.

BRIEF DESCRIPTION OF THE DRAWINGS

For a better understanding of the invention, and to show how embodiments of the same may be carried into effect, reference will now be made, by way of example, to the accompanying diagrammatic drawings, in which:

FIG. 4 is a timing diagram of a conventional operating process when there is an occurrence of a suspend command during an erase mode; and FIG. 5 is a timing diagram of an advanced operating process when there is an occurrence of a suspend command during the erase mode.

In the figures, like reference numerals denote like or corresponding parts.

DETAILED DESCRIPTION OF THE PREFERRED EMBODIMENTS

Figure 1:
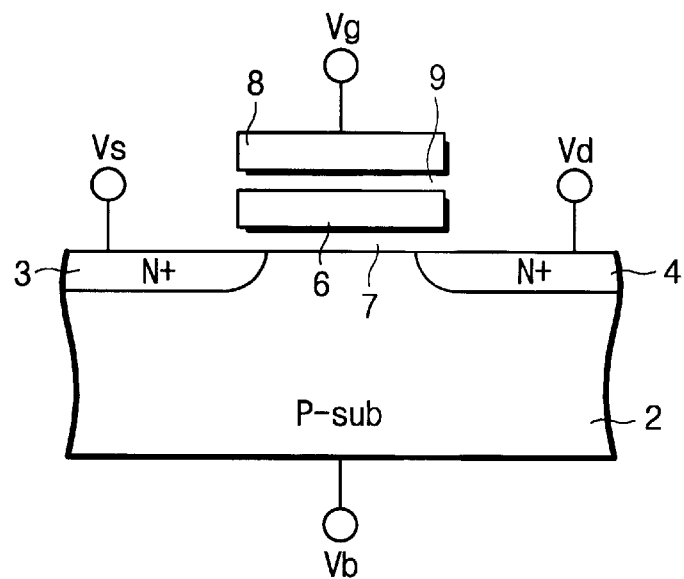
FIG. 1 is a section showing a structure of flash erasable and programmable read only memory cell.
Figure 2:
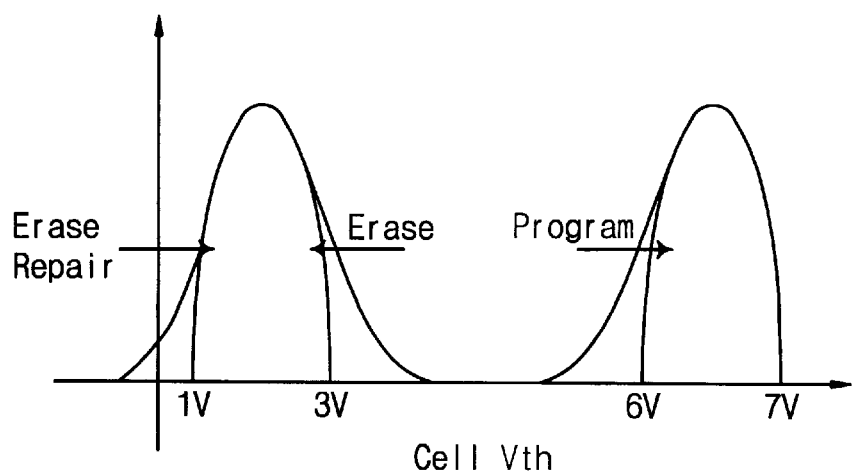
FIG. 2 shows variation of distributed profiles with threshold voltage in accordance with programming, erasing and erase repairing.
Figure 3:
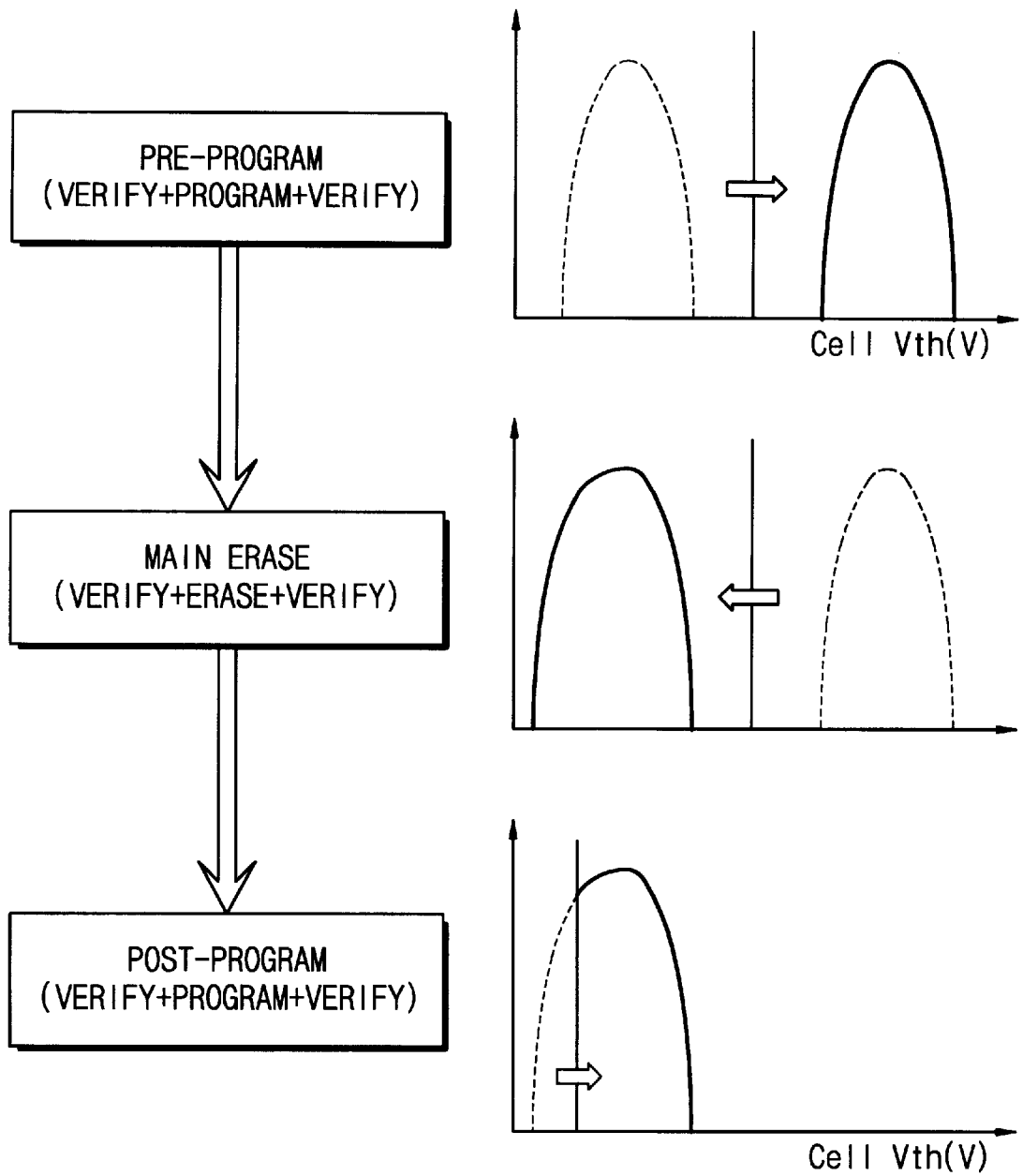
FIG. 3 is a flow chart explaining operating steps relevant to an erase mode in a NOR-type flash memory device.

Hereinbelow, applicable embodiments of the invention will be as follows, with the appended drawings.

FIG. 5 shows an operating flow of the invention, for instance, when the command of suspending is applied thereto while a main erasing step is being conductive. Fprp, Fmer, Fpop, Fs and Fr are flag signals for activating operations of pre-programming, main erasing, post-programming, suspending and resuming, respectively.

As aforementioned, the main erasing starts at time t0 by the activation of Fmer after the pre-programming. While proceeding the main erasing, if the command "suspend" (hereinafter referred to as "suspend command"), i.e., the flag signal Fs, is applied thereto, at time t1, to interrupt the current operation flow, the running main erasing is promptly disabled and the current Fmer that has an information the status of the erase operation is stored in a predetermined memory device. Once the information about the interrupted main erasing operation, the signal Fmer, is saved, read and programming operations for another sector are possible to be operable at least therefrom.

The time permitted to conduct a read or a programming for another sector is Tb lapping from t1, the time of the suspend command input, to t2 at which the command of resuming (i.e., the flag signal Fr), "resume" (hereinafter referred to as "resume command", appears. Once the resume command is activated therein, the former erase step involved in the suspend command, i.e., the main erasing, is enabled again by the flag signal Fmer which is read out from the memory device storing the information about the interrupted erase step.

As another case, if the suspend command with the flag signal Fs is applied thereto during the post-programming, the flag signal Fpop is promptly stored into the memory device (not shown) and the operating step of the post-programming is shut down thereof. After then, reading or programming for another sector can be operable until the resume command appears thereat. Once the resume command by the flag signal Fr is activated, the saved flag signal Fpop is read out from the memory device and thereby the stopped post-programming is performed again.

If the suspend command with the flag signal Fs is applied thereto during the pre-programming, the flag signal Fprp is promptly stored into the memory device (not shown) and the pre-programming is shut down thereof. After then, reading or programming for another sector can be operable until the resume command appears thereat. Once the resume command, i.e., the flag signal Fr, is activated, the saved flag signal Fprp is read out from the memory device and thereby the stopped post-programming is performed again.

The suspend command can appear at any time during the steps of erasing, pre-programming, main erasing and post-programming, the admitted time for another sector is just from after the suspend command. After returning the interrupted step of the erase mode, the sequential order of performing steps is arranged in a normal process. Though the suspend command appears any time during the erase mode including pre-programming, main erasing and post-programming, there is not any delay in performing a read or programming for another sector until the resume command is applied thereto.

Although embodiment of the invention have been disclosed and described, it will be appreciate that other embodiments and modification of the invention are possible.

What is claimed is:

1. A method for erasing electrically erasable and programmable memory cells arranged in a plurality of sectors, in a memory device receiving a suspend command and a resume command, the erasing including steps of pre-programming, main erasing and post-programming, the method comprising the steps of:

stopping a current step of the erasing when the suspend command appears thereat and storing a flag signal in a predetermined memory area;

performing a read or programming for another sector after the stopping the current step until the resume command is applied thereto; and resuming the current step in response to an activation of the resume command.

* * * * *